US008643376B2

(12) United States Patent
Ishikawa et al.

(10) Patent No.: US 8,643,376 B2
(45) Date of Patent: Feb. 4, 2014

(54) VOLTAGE MEASURING APPARATUS OF ASSEMBLED BATTERY

(75) Inventors: Satoshi Ishikawa, Makinohara (JP); Masashi Sekizaki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 547 days.

(21) Appl. No.: 12/714,725

(22) Filed: Mar. 1, 2010

(65) Prior Publication Data

US 2010/0225327 A1    Sep. 9, 2010

(30) Foreign Application Priority Data

Mar. 4, 2009 (JP) .................................. 2009-050799
Mar. 10, 2009 (JP) .................................. 2009-056346

(51) Int. Cl.
*G01N 27/416* (2006.01)
(52) U.S. Cl.
USPC .......................................... 324/434; 320/162
(58) Field of Classification Search
USPC ......................................................... 324/434
See application file for complete search history.

(56) References Cited

U.S. PATENT DOCUMENTS

| 6,762,588 | B2 * | 7/2004 | Miyazaki et al. ............. 320/116 |
| 7,489,112 | B2 | 2/2009 | Ishikawa et al. |
| 7,863,904 | B2 | 1/2011 | Takeda et al. |
| 2006/0273802 | A1 * | 12/2006 | Murakami et al. ............. 324/434 |
| 2007/0170889 | A1 | 7/2007 | Ishikawa et al. |
| 2007/0202371 | A1 | 8/2007 | Takeda et al. |

FOREIGN PATENT DOCUMENTS

| JP | 58170570 U | 11/1983 |
| JP | 03265416 A | 11/1991 |
| JP | 04145375 A | 5/1992 |
| JP | 07005993 A | 1/1995 |
| JP | 09027749 A | 1/1997 |
| JP | 2000031823 A | 1/2000 |
| JP | 2002-290236 A | 10/2002 |
| JP | 2002323519 A | 11/2002 |
| JP | 2005-62028 A | 3/2005 |
| JP | 2007-192706 A | 8/2007 |
| JP | 2007232417 A | 9/2007 |
| JP | 2007242529 A | 9/2007 |

OTHER PUBLICATIONS

Japanese Office Action issued on Oct. 16, 2012 in corresponding Japanese Patent Application No. 2009-056346.
Office Action, dated Nov. 20, 2012, issued by the Japanese Patent Office in counterpart Japanese Application No. 2009-050799.

* cited by examiner

*Primary Examiner* — Drew A Dunn
*Assistant Examiner* — Robert Grant
(74) *Attorney, Agent, or Firm* — Sughrue Mion, PLLC

(57) ABSTRACT

A voltage measuring apparatus for measuring an output voltage of an assembled battery in which a plurality of unit cells are connected in series and are divided into a plurality of blocks is provided. The voltage measuring apparatus includes: a block voltage detection unit which detects a voltage of at least one of the plurality of blocks; a sampling voltage generation unit which is provided in the block voltage detection unit and generates an analog sampling voltage applied in the sampling voltage generation unit; an A/D conversion unit which is provided in the block voltage detection unit and digitizes the analog sampling voltage to output a digital sampling voltage; and a voltage variation detection unit which obtains an error ratio of the voltage detected by the block voltage detection unit based on the digital sampling voltage.

10 Claims, 6 Drawing Sheets

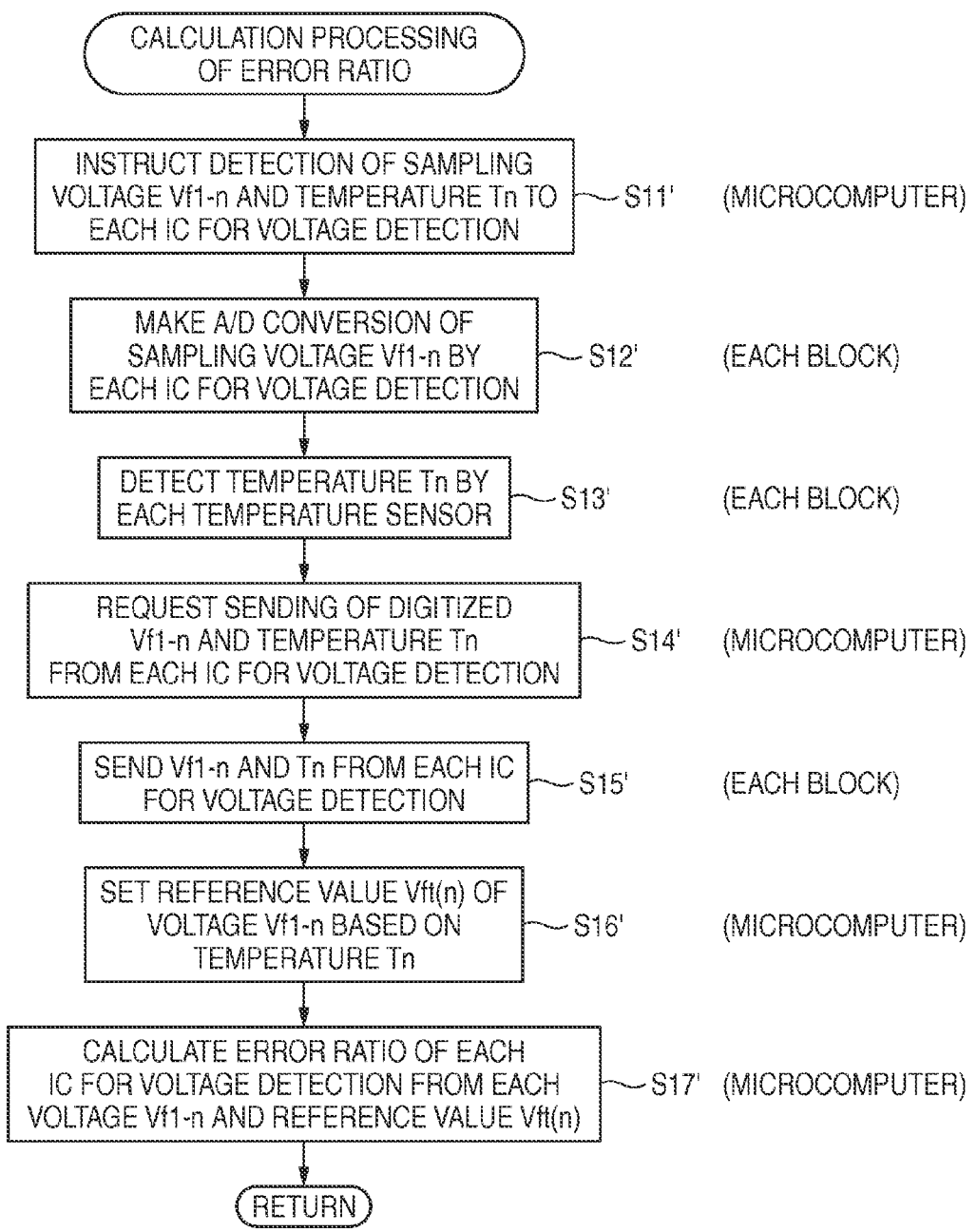

VOLTAGE MEASURING APPARATUS OF ASSEMBLED BATTERY

BACKGROUND OF THE INVENTION

1. Technical Field

The present invention relates to a voltage measuring apparatus for detecting an output voltage of an assembled battery in which a plurality of unit cells are connected in series and a desired voltage is output.

2. Background Art

For example, a hybrid vehicle includes a high-voltage battery as a driving power source of a motor. In the high-voltage battery, a plurality of unit cells of a secondary battery (storage battery) such as a lithium battery or a nickel hydride battery are connected in series, thus a high voltage is obtained.

It is necessary to check a charge state every each unit cell so that a secondary battery does not become an overdischarge state or an overcharge state. Conventionally, a plurality of (for example, 55) unit cells are divided into, for example, five blocks (that is, one block by 11 unit cells) and a voltage of each of the blocks is measured in real time by an IC for voltage detection disposed every each block.

In this case, in the IC for voltage detection, a voltage of unit cells (for example, 11) of one block is measured and further, an analog voltage signal detected is converted into a digital signal by an A/D converter provided in the IC for voltage detection, and the digital signal is sent to a main microcomputer. Thereafter, by the main microcomputer, when there is the block in which abnormality of a voltage occurs, it is constructed so that a warning is issued and a crew of a vehicle is notified of the voltage abnormality or correction processing of the voltage is performed (for example, see JP-A-2005-62028).

However, in the conventional voltage measuring apparatus, a voltage for A/D conversion used in an A/D converter is generated from a voltage obtained from each unit cell, so that the voltage for A/D conversion may vary and in such a case, an error may occur when a voltage detected in each block is digitized. As a result of this, there is a problem that high-accuracy voltage detection cannot be performed.

SUMMARY OF THE INVENTION

The invention has been implemented to solve such a conventional problem, and an object of the invention is to provide a voltage measuring apparatus of an assembled battery capable of detecting an error when a voltage for A/D conversion varies and an error occurs in a voltage signal digitized.

A voltage measuring apparatus according to an aspect of the invention for measuring an output voltage of an assembled battery in which a plurality of unit cells are connected in series and are divided into a plurality of blocks, the voltage measuring apparatus including: a block voltage detection unit which detects a voltage of at least one of the plurality of blocks; a sampling voltage generation unit which is provided in the block voltage detection unit and generates an analog sampling voltage applied in the sampling voltage generation unit; an A/D conversion unit which is provided in the block voltage detection unit and digitizes the analog sampling voltage to output a digital sampling voltage; and a voltage variation detection unit which obtains an error ratio of the voltage detected by the block voltage detection unit based on the digital sampling voltage.

According to the configuration, by a sampling voltage generation unit disposed in each of the block voltage detection units, a sampling voltage is generated and A/D conversion of the sampling voltage is made and a digital sampling voltage is generated. Then, an error ratio of a voltage detected by each of the block voltage detection units is obtained based on the generated digital sampling voltage. Therefore, an error included in the voltage detected by each of the block voltage detection units can be recognized and thus a unit cell voltage of each block can be measured with high accuracy.

BRIEF DESCRIPTION OF THE DRAWINGS

In the accompanying drawings:

FIG. 7 is a flowchart showing a procedure of calculation processing of an error ratio of the voltage measuring apparatus according to the second embodiment of the invention.

DETAILED DESCRIPTION OF THE EXEMPLARY EMBODIMENTS

Figure 1:
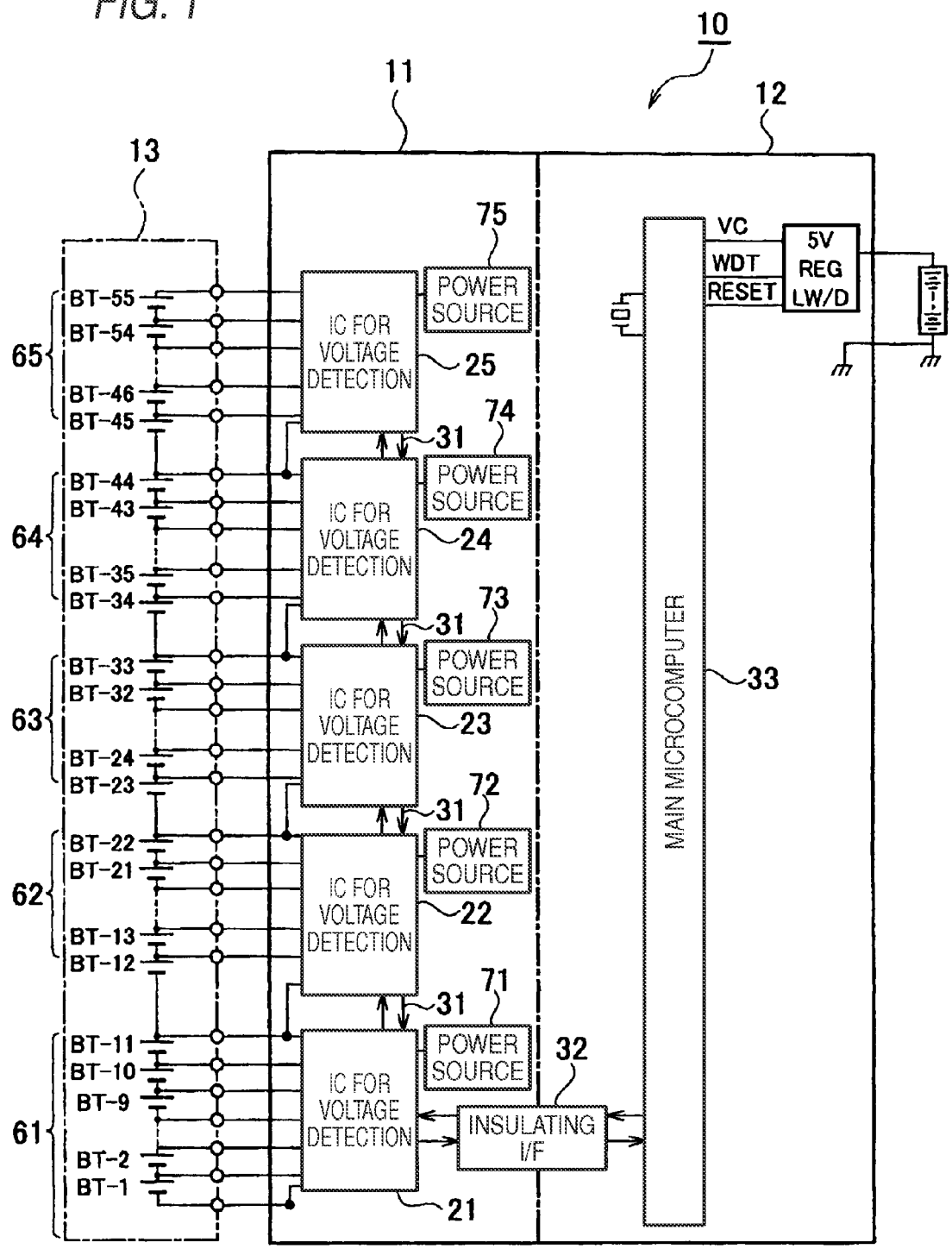
FIG. 1 is a block diagram showing a configuration of a voltage measuring apparatus according to a first embodiment of the invention.

A voltage measuring apparatus according to an aspect of the invention for measuring an output voltage of an assembled battery in which a plurality of unit cells are connected in series and are divided into a plurality of blocks, the voltage measuring apparatus including: a block voltage detection unit which detects a voltage of at least one of the plurality of blocks; a sampling voltage generation unit which is provided in the block voltage detection unit and generates an analog sampling voltage applied in the sampling voltage generation unit; an A/D conversion unit which is provided in the block voltage detection unit and digitizes the analog sampling voltage to output a digital sampling voltage; and a voltage variation detection unit which obtains an error ratio of the voltage detected by the block voltage detection unit based on the digital sampling voltage.

According to the configuration, by a sampling voltage generation unit disposed in each of the block voltage detection units, a sampling voltage is generated and A/D conversion of the sampling voltage is made and a digital sampling voltage is generated. Then, an error ratio of a voltage detected by each of the block voltage detection units is obtained based on the generated digital sampling voltage. Therefore, an error included in the voltage detected by each of the block voltage detection units can be recognized and thus a unit cell voltage of each block can be measured with high accuracy.

The voltage measuring apparatus may be configured in that the voltage variation detection unit calculates a reference value of sampling voltage and obtains the error ratio based on the reference value.

According to the configuration, the error ratio of the voltage is obtained based on the reference value. Therefore, an error included in the voltage detected by each of the block voltage detection units can be recognized and thus a unit cell voltage of each block can be measured with high accuracy.

The voltage measuring apparatus may be configured in that the block voltage detection unit comprises a plurality of sub-units, each sub-unit detecting a voltage of at least one of the plurality of blocks and having the sampling voltage generation unit and the A/D conversion unit therein.

According to the configuration, each sub-unit of the block voltage detection unit detects a voltage of at least one of the plurality of blocks and has the sampling voltage generation unit and the A/D conversion unit therein. Therefore, the sampling voltage is acquired for each of the blocks, and the error ratio can be obtained based on the sampling voltages, and thus a unit cell voltage of each block can be measured with high accuracy.

The voltage measuring apparatus may be configured in that the voltage variation detection unit calculates an average value of the digital sampling voltages and obtains the error ratio based on the average value.

According to the configuration, the error ratio is obtained based on the average value of the digital sampling voltages obtained by the block voltage detection unit and an error occurring in a measured voltage is recognized based on the error ratio, so that a unit cell voltage of each block can be measured with higher accuracy.

The voltage measuring apparatus may be configured by further comprising: a temperature sensing unit which is electrically connected to the block voltage detection unit and senses a temperature of the block voltage detection unit, and wherein the voltage variation detection unit obtains the error ratio based on both of the temperature detected by the temperature sensing unit and the digital sampling voltage.

According to the configuration, an ambient temperature of each of the block voltage detection units is detected by the temperature sensing unit. Then, based on the ambient temperature, the error ratio of a voltage detected by each of the block voltage detection units is obtained. Therefore, an error included in the voltage detected by each of the block voltage detection units can be recognized and thus a unit cell voltage of each block can be measured with high accuracy.

The voltage measuring apparatus may be configured in that the voltage variation detection unit calculates a reference value of sampling voltage based on the temperature detected by the temperature sensing unit and obtains the error ratio based on the reference value.

The voltage measuring apparatus may be configured in that the voltage variation detection unit obtains the error ratio based on a difference between the digital sampling voltage and the reference value.

According to the configurations, based on the ambient temperature, a reference value of sampling voltage is obtained by computation and the voltage is compared with the digital sampling voltage and thereby, an error ratio of a voltage detected by each of the block voltage detection units is obtained. Therefore, an error included in the voltage detected by each of the block voltage detection units can be recognized and thus a unit cell voltage of each block can be measured with high accuracy.

The voltage measuring apparatus may be configured by further comprising: temperature sensing units, each unit electrically connected to the respective sub units and detecting a temperature of each sub-unit, and wherein the voltage variation detection unit obtains error ratios of the plurality of blocks based on the temperatures detected by the temperature sensing units and the digital sampling voltages.

The voltage measuring apparatus may be configured in that the sampling voltage generation unit generates the analog sampling voltage using a voltage applied to a PN junction part of a silicon semiconductor.

According to the configuration, a voltage applied to the PN junction part of the silicon semiconductor is used as a sampling voltage and when the PN junction part can acquire an ambient temperature, a generated voltage can be obtained by computation, so that calculation accuracy of a reference value of a sampling voltage used in each of the block voltage detection units can be improved and an error ratio can be obtained with higher accuracy. As a result of that, a unit cell voltage of each block can be measured with high accuracy.

The voltage measuring apparatus may be configured in that the sampling voltage generation unit comprises a series connection circuit of a diode and a resistor, and sets a voltage applied to both ends of the diode at the time of passing a current through the series connection circuit to the analog sampling voltage.

According to the configuration, a voltage generated between an anode and a cathode of a diode is used as a sampling voltage and when the diode can acquire an ambient temperature, a generated voltage can be obtained by computation, so that calculation accuracy of a reference value of a sampling voltage used in each of the block voltage detection units can be improved and an error ratio can be obtained with higher accuracy. As a result of that, a unit cell voltage of each block can be measured with high accuracy.

The voltage measuring apparatus may be configured in that the series connection circuit comprises a resistor and a plurality of diodes connected in series, and sets a voltage applied to both ends of the plurality of diodes connected in series to the sampling voltage.

According to the configuration, the plurality of diodes are connected in series and a voltage applied to both ends of the series connection is set at the sampling voltage, so that a higher voltage can be set at the sampling voltage and a digital sample signal obtained by A/D conversion can be set at a higher value, so that an error ratio can be obtained with higher accuracy.

Exemplary embodiments of the invention will hereinafter be described with reference to the accompanying drawings.

(First Embodiment)

A first embodiment of the invention will be described with reference to FIGS. 1 to 5. FIG. 1 is a block diagram showing a secondary battery 13 (an assembled battery) including a plurality of unit cells BT1 to BT55 and a voltage measuring apparatus 10 according to a first embodiment of the invention. As shown in FIG. 1, the voltage measuring apparatus 10 according to the first embodiment is separated into a high-voltage side unit 11 and a low-voltage side unit 12 through an insulating interface 32.

The high-voltage side unit 11 includes five ICs for voltage detection, that is, a first IC (21) for voltage detection to a fifth IC (25) for voltage detection. The first IC (21) for voltage detection measures voltages of first 11 unit cells BT1 to BT11 delimited as a first block 61. Also, the second IC (22) for voltage detection measures voltages of second 11 unit cells BT12 to BT22 delimited as a second block 62 and similarly, the third IC (23) for voltage detection measures voltages of third 11 unit cells BT23 to BT33 delimited as a third block 63, and the fourth IC (24) for voltage detection measures voltages of fourth 11 unit cells BT34 to BT44 delimited as a fourth block 64, and the fifth IC (25) for voltage detection measures voltages of fifth 11 unit cells BT45 to BT55 delimited as a fifth block 65.

The first IC (21) to the fifth IC (25) for voltage detection can be referred to as a block voltage detection unit as a whole, and each of the first IC (21) to the fifth IC (25) for voltage detection can be referred to as a sub-unit of the block voltage detection unit.

Also, each of the ICs (21) to (25) for voltage detection includes an A/D converter (A/D conversion unit), and a voltage signal (voltage signal in which 11 unit cells are connected in series) measured every each of the blocks (first block to fifth block) is converted into a digital voltage signal using voltages for A/D conversion output from power sources 71 to 75 for A/D conversion.

Also, the second IC (22) to the fifth IC (25) for voltage detection are connected to the first IC (21) for voltage detection through communication lines 31, and the IC (21) for voltage detection is connected to a main microcomputer (voltage variation detection unit) 33 disposed in the side of the low-voltage side unit 12 through the insulating interface 32.

Further, in the voltage measuring apparatus 10 according to the embodiment, a sampling voltage is generated by each of the ICs (21) to (25) for voltage detection and the sampling voltage is digitized by the A/D converter. An error ratio of a voltage detected by each of the ICs (21) to (25) for voltage detection is obtained based on a sample signal digitized by each of the ICs (21) to (25) for voltage detection. Further, a digital voltage signal sent from each of the ICs (21) to (25) for voltage detection is corrected based on the obtained error ratio. The details will be described below.

Figure 2:
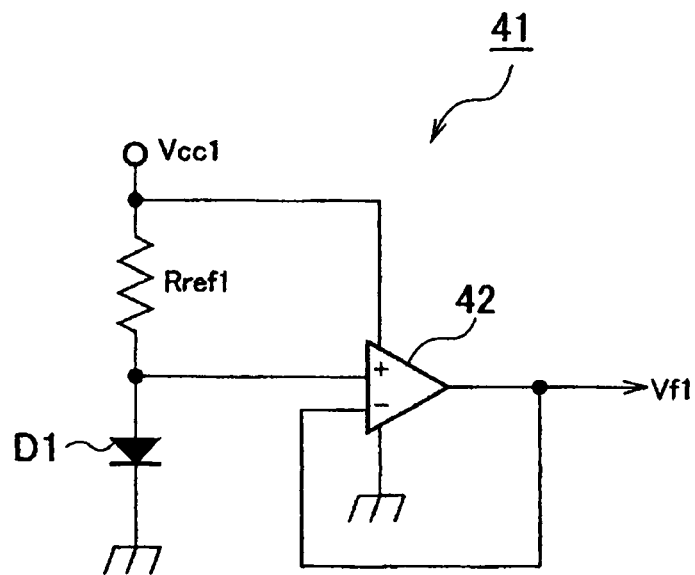
FIG. 2 is a circuit diagram showing a sampling voltage generation circuit disposed in each of the ICs for voltage detection of the voltage measuring apparatus according to the first embodiment of the invention.

FIG. 2 is an explanatory diagram showing a sampling voltage generation circuit 41 disposed inside each of the ICs (21) to (25) for voltage detection. As shown in FIG. 2, the sampling voltage generation circuit 41 includes a series connection circuit of a resistor Rref1 and a diode D1, and one end of the resistor Rref1 is connected to a supply point of a voltage Vcc and one end of the diode D1 is grounded in a ground. Also, a point of connection between the resistor Rref1 and the diode D1 is connected to a buffer amplifier 42. Therefore, a voltage generated in an output terminal of the buffer amplifier 42 becomes a voltage in which a voltage applied to both ends of the diode D1 is stabilized, and the voltage is set at a sampling voltage (analog sampling voltage) Vf1.

Now, in the case of assuming the case where the diode D1 is constructed of a silicon semiconductor and a current with a certain value or more flows through the resistor Rref1, it is known that the sampling voltage Vf1 becomes about 650 mV when an ambient temperature is 20° C. Also, the silicon semiconductor has temperature characteristics of −2 mV/° C., so that the sampling voltage Vf1 decreases by 2 mV when the ambient temperature increases by 1° C.

That is, in the case of assuming that an ambient temperature of the voltage measuring apparatus 10 is constant, a sampling voltage Vf1 generated by the sampling voltage generation circuit 41 disposed in each of the ICs (21) to (25) for voltage detection becomes substantially the same voltage.

Next, an operation of the voltage measuring apparatus 10 according to the embodiment will be described with reference to a flowchart shown in FIG. 4.

First, in step S11, the main microcomputer 33 sends a signal for instructing detection of a sampling voltage Vf1 to each of the ICs (21) to (25) for voltage detection. Here, a suffix "-n" is assigned in order to distinguish a voltage Vf1 for temperature correction generated by the sampling voltage generation circuit 41 of each of the ICs (21) to (25) for voltage detection. For example, a sampling voltage generated by the sampling voltage generation circuit 41 of the first IC (21) for voltage detection is shown by "Vf1-1" and a sampling voltage generated by the sampling voltage generation circuit 41 of the second IC (22) for voltage detection is shown by "Vf1-2" and hereinafter, sampling voltages are similarly shown by "Vf1-3", "Vf1-4" and "Vf1-5".

In step S12, each of the ICs (21) to (25) for voltage detection makes A/D conversion of the sampling voltages Vf1-1 to Vf1-5 generated by the sampling voltage generation circuit 41, and generates the digitized sampling voltages Vf1-1 to Vf1-5 (digital sampling voltages).

In step S13, the main microcomputer 33 requests sending of the digitized sampling voltages Vf1-1 to Vf1-n from each of the ICs (21) to (25) for voltage detection.

In step S14, each of the ICs (21) to (25) for voltage detection sends the digitized sampling voltages Vf1-1 to Vf1-n to the main microcomputer 33 through the insulating interface 32.

In step S15, the main microcomputer 33 calculates an average value of the sampling voltages Vf1-1 to Vf1-n sent from each of the ICs (21) to (25) for voltage detection, and sets the average value as a reference value Vft.

In step S16, the main microcomputer 33 obtains error ratios Verr(n) by the following formula (1) based on the reference value Vft obtained in processing of step S15 and the sampling voltages Vf1-1 to Vf1-5 sent from each of the ICs (21) to (25) for voltage detection.

$$Verr(n)=(Vf1\text{-}n-Vft)/Vft \text{ where } n=1 \text{ to } 5 \qquad (1)$$

Thus, the error ratios Verr(n) every each of the ICs (21) to (25) for voltage detection is obtained.

Next, a procedure of voltage correction processing for correcting a voltage of each of the blocks 61 to 65 detected by each of the ICs (21) to (25) for voltage detection will be described with reference to a flowchart shown in FIG. 5.

In step S21, the main microcomputer 33 sends a signal for instructing voltage detection to each of the ICs (21) to (25) for voltage detection. This processing is performed, for example, every 160 msec.

In step S22, each of the ICs (21) to (25) for voltage detection measures a voltage of a unit cell disposed in each of the blocks 61 to 65. As a result of that, a series connection voltage of the unit cells BT1 to BT11 of the first block 61 is obtained and similarly, series connection voltages of 11 unit cells of the second block 62, the third block 63, the fourth block 64 and the fifth block 65 are obtained.

In step S23, each of the ICs (21) to (25) for voltage detection performs A/D conversion processing of a voltage of each of the blocks 61 to 65 measured in processing of step S22 and makes conversion into a digital signal.

In step S24, each of the ICs (21) to (25) for voltage detection sends a digitized voltage signal to the main microcomputer 33 through the communication lines 31 and the insulating interface 32.

Figure 4:
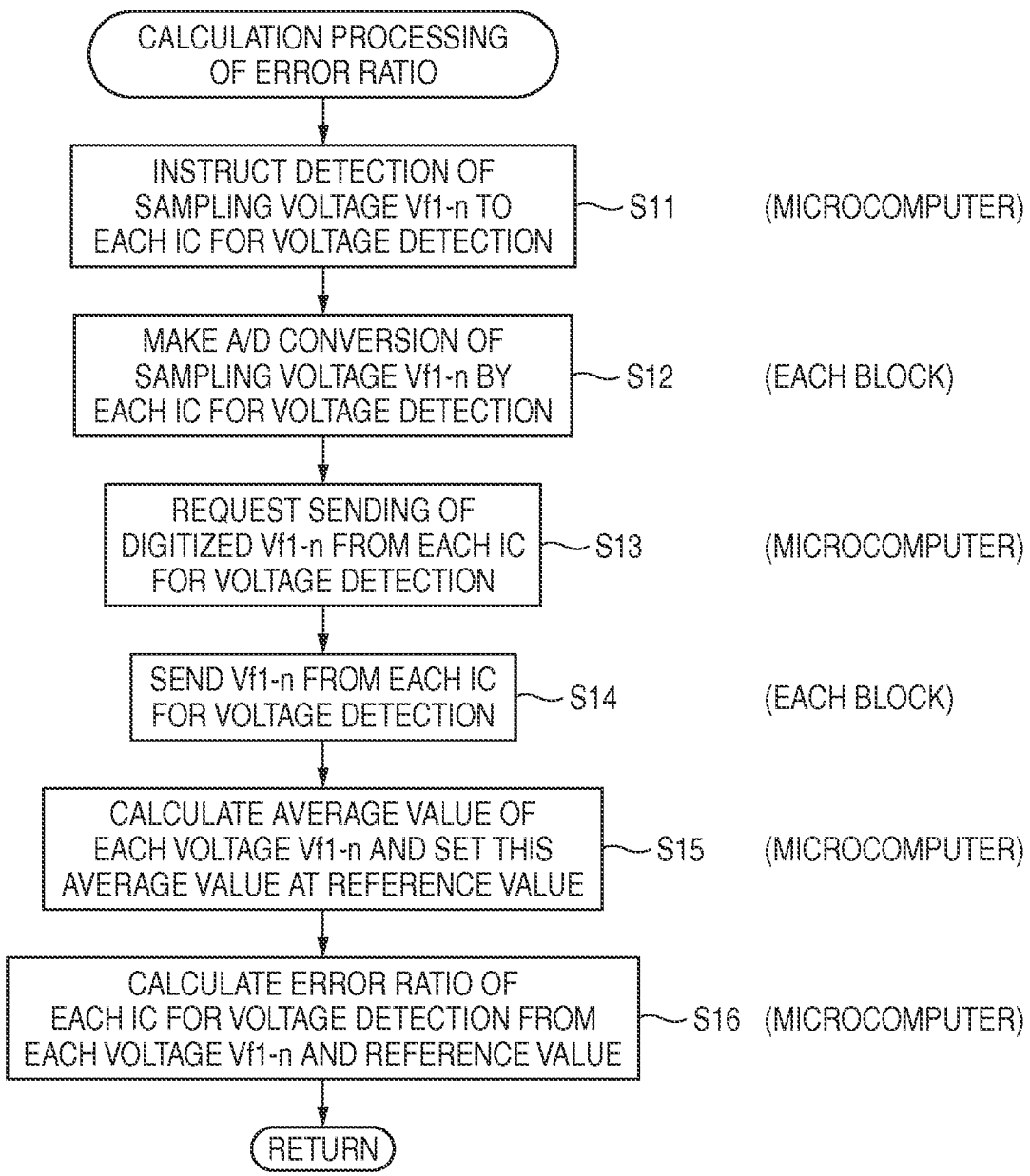
FIG. 4 is a flowchart showing a procedure of calculation processing of an error ratio of the voltage measuring apparatus according to the first embodiment of the invention.

In step S25, the main microcomputer 33 corrects a voltage signal sent from each of the ICs (21) to (25) for voltage detection using the following formula (2) based on the error ratios Verr(1) to Verr(5) every each of the ICs (21) to (25) for voltage detection acquired by calculation processing of the error ratios shown in FIG. 4.

$$Vn^*=Vn+Vn\times Verr(n) \qquad (2)$$

Where, Vn is a voltage signal output from the nth IC for voltage detection, and Vn* is a voltage in which the voltage signal output from the nth IC for voltage detection is corrected, and Verr(n) is an error ratio obtained by the nth IC for voltage detection.

Thus, a voltage of each of the blocks 61 to 65 can be obtained with high accuracy even when variations occur in output voltages of the power sources 71 to 75 for A/D conversion used in each of the ICs (21) to (25) for voltage detection.

In the voltage measuring apparatus 10 according to the embodiment in this manner, sampling voltages Vf1 (Vf1-1 to Vf1-n) are generated by the sampling voltage generation circuit 41 disposed in each of the ICs (21) to (25) for voltage detection and an average of digital voltage signals obtained by making A/D conversion of the sampling voltages is calculated and a reference value Vft is obtained. Further, an error ratio Verr(n) is calculated based on the reference value Vft and each of the sampling voltages Vf1. Then, a voltage of each of the blocks 61 to 65 actually detected is corrected using the error ratio Verr(n).

Therefore, even when variations are present in voltages for A/D conversion output from the power sources 71 to 75 for A/D conversion and an error is present in a voltage signal after A/D conversion, this is corrected and a voltage of each of the blocks 61 to 65 can be measured with high accuracy.

Also, as shown in FIG. 2, a current is passed through the diode D1 constructed of a silicon semiconductor and a voltage applied to both ends of this diode D1 is set at a sampling voltage Vf1, so that the sampling voltage Vf1 generated by the sampling voltage generation circuit 41 of each of the ICs (21) to (25) for voltage detection becomes substantially a constant voltage (for example, 650 mV at 20° C.) and an error ratio can be obtained with high accuracy.

Further, a voltage of each of the blocks 61 to 65 and the sampling voltage Vf1 digitized by the high-voltage side unit 11 are sent to the main microcomputer 33 disposed in the low-voltage side unit 12 through the insulating interface 32 and an error ratio is calculated and a measured voltage is further corrected, so that these computation processing can be executed in the low-voltage side unit 12 and the computation processing can be performed efficiently.

(Second Embodiment)

A second embodiment of the invention will be described with reference to FIGS. 6 to 7. Elements of the second embodiment that are the same as those of the first embodiment are assigned the same reference numerals, and their repeated explanations are omitted.

Figure 6:
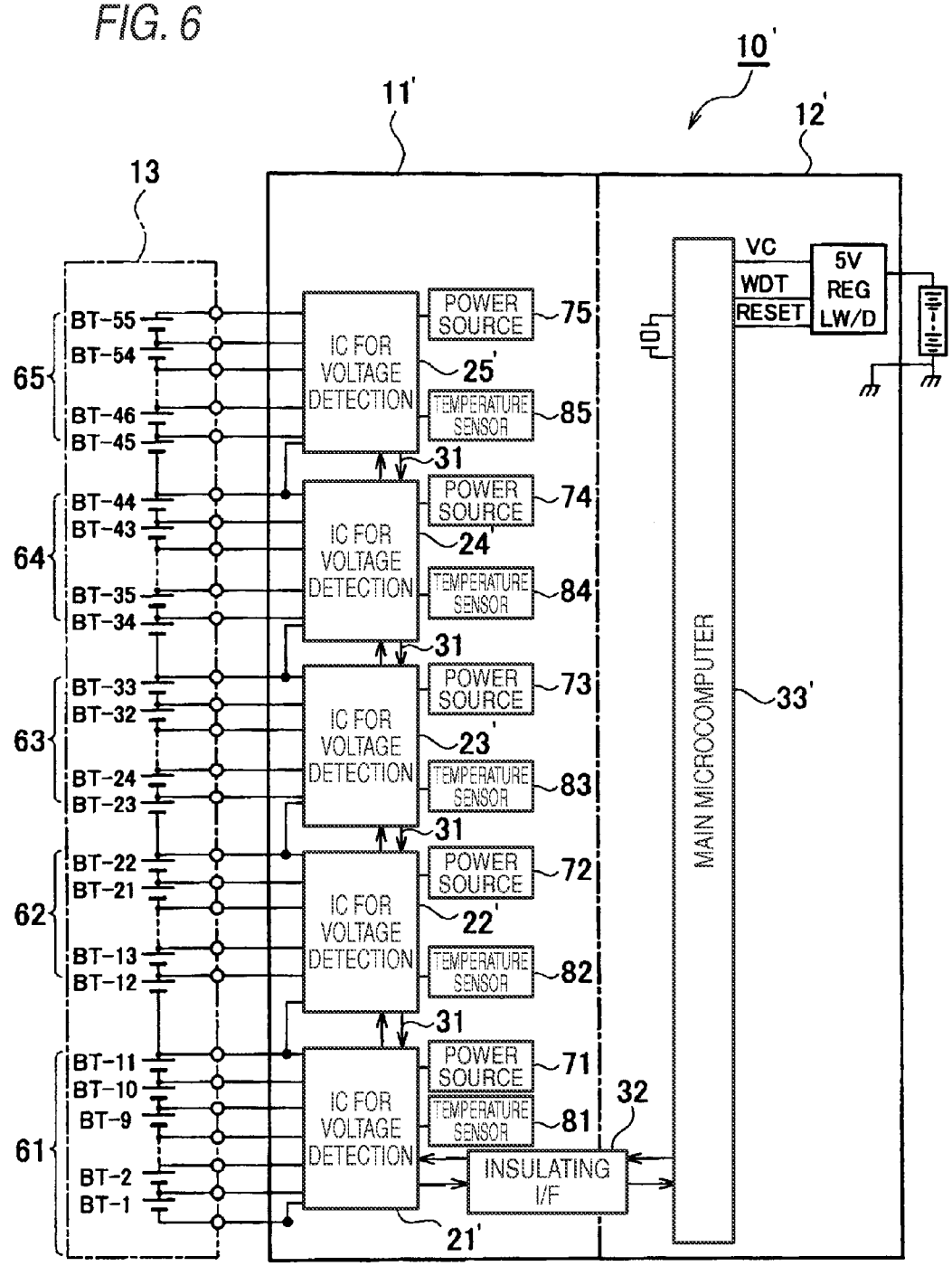
FIG. 6 is a block diagram showing a configuration of a voltage measuring apparatus according to a second embodiment of the invention.

FIG. 6 is a block diagram showing a secondary battery 13 (an assembled battery) including a plurality of unit cells BT1 to BT55 and a voltage measuring apparatus 10' according to the second embodiment of the invention. As shown in FIG. 6, the voltage measuring apparatus 10' according to the second embodiment is separated into a high-voltage side unit 11' and a low-voltage side unit 12' through an insulating interface 32.

The voltage measuring apparatus 10' according to the second embodiment differs from the voltage measuring apparatus of the first embodiment in that the high-voltage side unit 11' further includes temperature sensors (temperature sensing units) 81 to 85, and that the first IC (21) to the fifth IC (25) for voltage detection and the main microcomputer 33 are replaced with a first IC(21') to a fifth IC (25') for voltage detection and a main microcomputer 33', respectively.

The temperature sensors 81 to 85 are disposed in each of the ICs (21') to (25') for voltage detection, and the temperature sensors 81 to 85 sense temperatures of each of the ICs (21') to (25') for voltage detection.

The second IC (22') to the fifth IC (25') for voltage detection are connected to the first IC (21') for voltage detection through communication lines 31, and the IC (21') for voltage detection is connected to the main microcomputer (voltage variation detection unit) 33' disposed in the side of the low-voltage side unit 12' through the insulating interface 32. Therefore, a voltage signal measured by each of the ICs (21') to (25') for voltage detection and a temperature signal sensed by each of the temperature sensors 81 to 85 are converted into digital signals and thereafter are sent to the main microcomputer 33' through the communication lines 31.

In the voltage measuring apparatus 10' according to the second embodiment, a sampling voltage is generated by each of the ICs (21') to (25') for voltage detection and the sampling voltage is digitized by the A/D converter and an error ratio of a voltage detected by each of the ICs (21') to (25') for voltage detection is obtained based on ambient temperatures detected by the temperature sensors 81 to 85 of each of the ICs (21') to (25') for voltage detection and a sample signal digitized by each of the ICs (21') to (25') for voltage detection. Further, a digital voltage signal sent from each of the ICs (21') to (25') for voltage detection is corrected based on the obtained error ratio. The details will be described below.

The configuration of the sampling voltage generation circuit 41 disposed inside each of the ICs (21') to (25') for voltage detection is the same as that of the first embodiment, as shown in FIG. 2.

Now, in the case of assuming the case where the diode D1 is constructed of a silicon semiconductor and a current with a certain value or more flows through the resistor Rref1, it is known that the sampling voltage Vf1 becomes about 650 mV when an ambient temperature is 20° C. Also, the silicon semiconductor has temperature characteristics of −2 mV/° C., so that the sampling voltage Vf1 decreases by 2 mV when the ambient temperature increases by 1° C.

That is, when the ambient temperature is sensed, the sampling voltage Vf1 generated by the sampling voltage generation circuit 41 disposed in each of the ICs (21') to (25') for voltage detection can be obtained by the computation described above.

Next, an operation of the voltage measuring apparatus 10' according to the embodiment will be described with reference to a flowchart shown in FIG. 7.

First, in step S11', the main microcomputer 33' sends a signal for instructing detection of a temperature and a signal for instructing detection of a sampling voltage Vf1 to each of the ICs (21') to (25') for voltage detection. Here, a suffix "-n" is assigned in order to distinguish a voltage Vf1 for temperature correction generated by the sampling voltage generation circuit 41 of each of the ICs (21') to (25') for voltage detection. For example, a sampling voltage generated by the sampling voltage generation circuit 41 of the first IC (21') for voltage detection is shown by "Vf1-1" and a sampling voltage generated by the sampling voltage generation circuit 41 of the second IC (22') for voltage detection is shown by "Vf1-2" and hereinafter, sampling voltages are similarly shown by "Vf1-3", "Vf1-4" and "Vf1-5". Also, temperatures sensed by the temperature sensors 81 to 85 disposed in each of the ICs (21') to (25') for voltage detection are respectively set at T1 to T5.

In step S12', each of the ICs (21') to (25') for voltage detection makes A/D conversion of the sampling voltages Vf1-1 to Vf1-5 generated by the sampling voltage generation circuit 41, and generates the digitized sampling voltages Vf1-1 to Vf1-5 (digital sampling voltages).

In step S13', the temperature sensors 81 to 85 disposed in each of the ICs (21') to (25') for voltage detection detect temperatures T1 to T5 of each of the ICs (21') to (25') for voltage detection.

In step S14', the main microcomputer 33' requests sending of the digitized sampling voltages Vf1-1 to Vf1-n and the temperatures T1 to T5 from each of the ICs (21') to (25') for voltage detection.

In step S15', each of the ICs (21') to (25') for voltage detection sends the digitized sampling voltages Vf1-1 to Vf1-n and the temperatures T1 to T5 to the main microcomputer 33' through the insulating interface 32.

In step S16', the main microcomputer 33' obtains true values of the sampling voltages Vf1-1 to Vf1-n by a predetermined computation formula based on the temperatures T1 to T5 sent from each of the ICs (21') to (25') for voltage detection and sets the true values as reference values Vft(n) (where n=1 to 5).

For example, it is known that a voltage between an anode and a cathode of the diode D1 is 650 mV at 20° C. and characteristics of −2 mV/° C. are had as described above. That is, a voltage decreases by 2 mV when a temperature increases by 1° C. The main microcomputer 33' obtains true values of the sampling voltages Vf1-1 to Vf1-n based on the characteristics and the temperatures T1 to T5 sent in processing of step S15 and sets the true values as reference values Vft(n).

In step S17', the main microcomputer 33' obtains an error ratio Verr(n) by the following formula (3) based on the reference values Vft(n) obtained in processing of step S16 and the sampling voltages Vf1-1 to Vf1-5 sent from each of the ICs (21') to (25') for voltage detection.

$$Verr(n)=(Vf1\text{-}n-Vft(n)) \text{ where } n=1 \text{ to } 5 \quad (3)$$

Thus, the error ratio Verr(n) every each of the ICs (21') to (25') for voltage detection is obtained.

Figure 5:
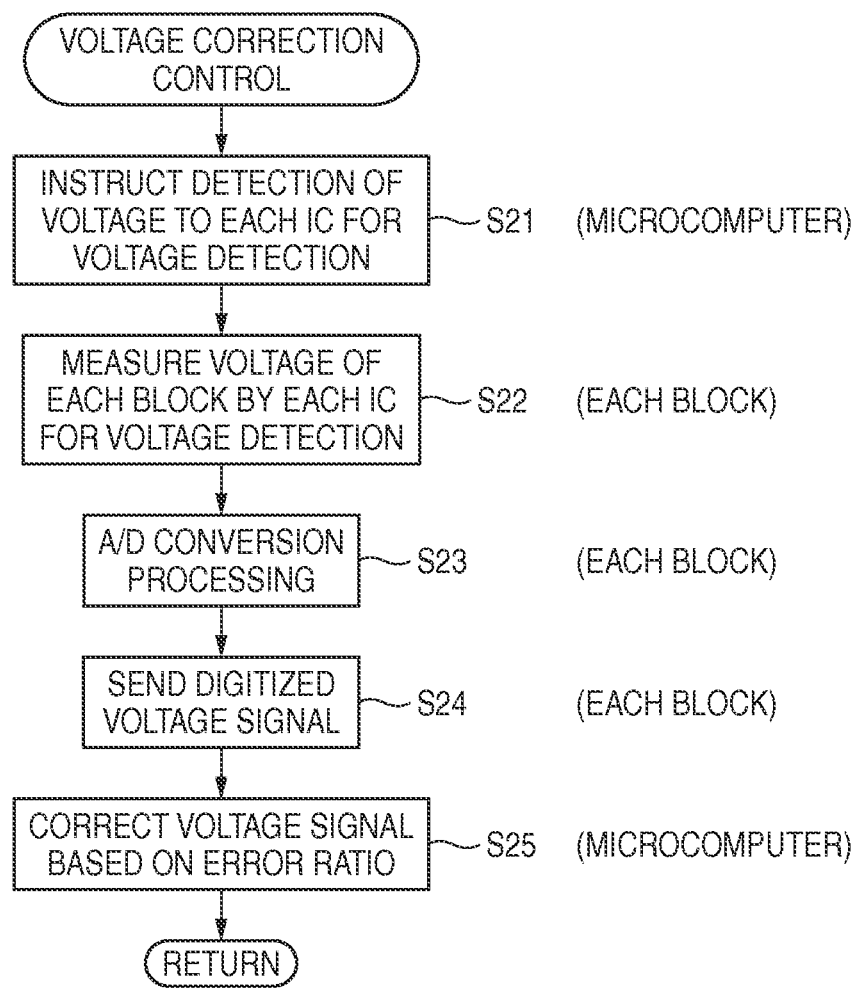
FIG. 5 is a flowchart showing a procedure of voltage correction control of the voltage measuring apparatus according to the first embodiment of the invention.

Then, a procedure of voltage correction processing for correcting a voltage of each of the blocks 61 to 65 detected by each of the ICs (21') to (25') for voltage detection is performed as shown in FIG. 5 as well as in the first embodiment.

Thus, a voltage of each of the blocks 61 to 65 can be obtained with high accuracy even when variations occur in output voltages of the power sources 71 to 75 for A/D conversion used in each of the ICs (21') to (25') for voltage detection.

In the voltage measuring apparatus 10' according to the embodiment in this manner, a reference value Vft(n) of a voltage acquired by the sampling voltage generation circuit 41 of each of the ICs (21') to (25') for voltage detection is obtained based on a temperature detected by each of the temperature sensors 81 to 85. Further, a digital sample signal obtained by making A/D conversion of the sampling voltages Vf1 (Vf1-1 to Vf1-n) generated by the sampling voltage generation circuit 41 of each of the ICs (21') to (25') for voltage detection is acquired. Then, the digital sample signal is compared with the reference value Vft(n) and an error ratio Verr(n) is calculated. Thus, a voltage of each of the blocks 61 to 65 actually detected can be corrected using the error ratio Verr(n).

Therefore, even when variations are present in voltages for A/D conversion output from the power sources 71 to 75 for A/D conversion and an error is present in a voltage signal after A/D conversion, this is corrected and a voltage of each of the blocks 61 to 65 can be measured with high accuracy.

Also, as shown in FIG. 2, a current is passed through the diode D1 constructed of a silicon semiconductor and a voltage applied to both ends of the diode D1 is set at a sampling voltage Vf1. Further, based on temperatures detected by the temperature sensors 81 to 85 and temperature characteristics of the semiconductor, the sampling voltage Vf1 is obtained by computation and the sampling voltage obtained by the computation is set at reference values Vft(n). Therefore, an error of the digitized sampling voltage Vf1 with respect to the reference value Vft(n) can be obtained every each of the ICs (21') to (25') for voltage detection and an error ratio can be obtained with high accuracy.

Further, a voltage of each of the blocks 61 to 65 and the sampling voltage Vf1 digitized by the high-voltage side unit 11' are sent to the main microcomputer 33' disposed in the low-voltage side unit 12' through the insulating interface 32 and an error ratio is calculated and a measured voltage is further corrected, so that these computation processing can be executed in the low-voltage side unit 12' and the computation processing can be performed efficiently.

Figure 3:
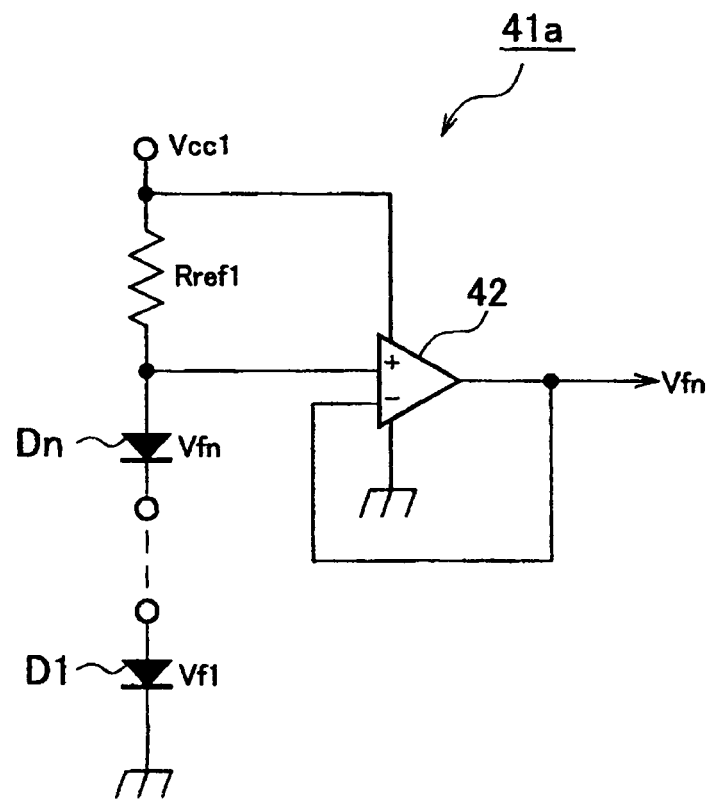
FIG. 3 is a circuit diagram showing a sampling voltage generation circuit disposed in each of the ICs for voltage detection of a voltage measuring apparatus according to a modified example of the invention.

Next, a modified example of the embodiments mentioned above will be described. FIG. 3 is a circuit diagram showing a configuration of a sampling voltage generation circuit 41a according to the modified example. As shown in FIG. 3, the sampling voltage generation circuit 41a differs from the sampling voltage generation circuit 41 shown in FIG. 2 in that a plurality of diodes are connected in series. That is, n diodes D1 to Dn are disposed between a resistor Rref1 and a ground, and a point of connection between the diode Dn and the resistor Rref1 is connected to a buffer amplifier 42, and one end of the diode D1 is grounded in a ground.

Then, according to such a configuration, a sampling voltage becomes n times (for example, in the case of n=5, 3.25 V at 20° C.) the voltage Vfn described above and an error ratio Verr(n) can be obtained using a larger voltage value, so that the error ratio Verr(n) can be obtained with higher accuracy and thus, measurement accuracy of a voltage of each of the blocks 61 to 65 can be improved.

The voltage measuring apparatus of an assembled battery of the invention has been described above based on the illustrated embodiment, but the invention is not limited to this, and a configuration of each part can be replaced with any configuration having a similar function.

For example, in the embodiments described above, the example using the diode constructed of a silicon semiconductor in the sampling voltage generation circuits 41, 41a has been described, but the invention can also use a diode other than the silicon semiconductor as long as a voltage generated in both ends is stabilized.

Also, a similar effect can be achieved even in the case of making connection between a base and an emitter of a bipolar transistor instead of a diode. Further, using reverse characteristics of a Zener diode, a constant voltage is generated and this voltage can also be used as a sampling voltage.

Further, in the embodiments described above, the example of correcting a voltage detected by each of the ICs (21) to (25) or (21') to (25') for voltage detection using the error ratio Verr(n) obtained has been described, but it can also be constructed so that a driver of a vehicle is notified of the error ratio Verr(n) obtained or a warning is output when the error ratios Verr(n) is larger than a preset threshold value.

Also, in the second embodiment described above, it has been constructed so as to obtain the reference value Vft(n) every each of the ICs (21') to (25') for voltage detection by computation based on temperatures detected by the temperature sensors 81 to 85, but it may be constructed so that a table indicating a relation between a reference value Vft(n) and a temperature is preset in memory etc. of the inside of the main microcomputer 33' and the reference value Vft(n) is obtained with reference to the table based on the temperatures T1 to T5 detected by the temperature sensors 81 to 85.

The present invention can be used in measurement of a voltage of a secondary battery mounted in a hybrid vehicle etc.

What is claimed is:

1. A voltage measuring apparatus for measuring an output voltage of an assembled battery in which a plurality of unit cells are connected in series and are divided into a plurality of blocks, the voltage measuring apparatus comprising:
   a block voltage detection unit which detects a voltage of at least one of the plurality of blocks;
   a sampling voltage generation unit which is provided in the block voltage detection unit and generates an analog sampling voltage applied in the sampling voltage generation unit;
   an A/D conversion unit which is provided in the block voltage detection unit and digitizes the analog sampling voltage to output a digital sampling voltage for each of the plurality of blocks; and
   a voltage variation detection unit which obtains an error ratio of the voltage detected by the block voltage detection unit for each of the plurality of blocks, wherein the error ratio is obtained based on the digital sampling voltage for each of the plurality of blocks,
   wherein the voltage variation detection unit calculates one average value of the digital sampling voltages from the plurality of blocks and obtains the error ratio for each of the plurality of blocks based on the average value set as a reference value and the digital sampling voltage for each of the plurality of blocks.

2. The voltage measuring apparatus according to claim 1, wherein the voltage variation detection unit calculates a reference value of sampling voltage and obtains the error ratio based on the reference value.

3. The voltage measuring apparatus according to claim 1, wherein the block voltage detection unit comprises a plurality of sub-units, each sub-unit detecting a voltage of at least one of the plurality of blocks and having the sampling voltage generation unit and the A/D conversion unit therein.

4. The voltage measuring apparatus according to claim 1, further comprising:
   a temperature sensing unit which is electrically connected to the block voltage detection unit and senses a temperature of the block voltage detection unit, and
   wherein the voltage variation detection unit obtains the error ratio based on both of the temperature detected by the temperature sensing unit and the digital sampling voltage.

5. The voltage measuring apparatus according to claim 4, wherein the voltage variation detection unit calculates a reference value of sampling voltage based on the temperature detected by the temperature sensing unit and obtains the error ratio based on the reference value.

6. The voltage measuring apparatus according to claim 5, wherein the voltage variation detection unit obtains the error ratio based on a difference between the digital sampling voltage and the reference value.

7. The voltage measuring apparatus according to claim 3, further comprising:
   temperature sensing units, each unit electrically connected to the respective sub units and detecting a temperature of each sub-unit, and
   wherein the voltage variation detection unit obtains error ratios of the plurality of blocks based on the temperatures detected by the temperature sensing units and the digital sampling voltages.

8. The voltage measuring apparatus according to claim 1, wherein the sampling voltage generation unit generates the analog sampling voltage using a voltage applied to a PN junction part of a silicon semiconductor.

9. The voltage measuring apparatus according to claim 1, wherein the sampling voltage generation unit comprises a series connection circuit of a diode and a resistor, and sets a voltage applied to both ends of the diode at the time of passing a current through the series connection circuit to the analog sampling voltage.

10. The voltage measuring apparatus according to claim 9, wherein the series connection circuit comprises a resistor and a plurality of diodes connected in series, and sets a voltage applied to both ends of the plurality of diodes connected in series to the sampling voltage.

* * * * *